(12) United States Patent
Hsu et al.

(10) Patent No.: US 11,728,314 B2
(45) Date of Patent: Aug. 15, 2023

(54) METHODS OF FORMING INTEGRATED CIRCUIT PACKAGES

(71) Applicant: Taiwan Semiconductor Manufacturing Company, Ltd., Hsinchu (TW)

(72) Inventors: Chia-Hao Hsu, Hsinchu (TW); Yung-Chi Lin, New Taipei (TW); Wen-Chih Chiou, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/458,549

(22) Filed: Aug. 27, 2021

(65) Prior Publication Data
US 2021/0391306 A1    Dec. 16, 2021

Related U.S. Application Data

(62) Division of application No. 16/441,013, filed on Jun. 14, 2019, now Pat. No. 11,145,623.

(51) Int. Cl.
| H01L 25/065 | (2023.01) |
| H01L 23/00 | (2006.01) |
| H01L 23/48 | (2006.01) |
| H01L 25/00 | (2006.01) |

(52) U.S. Cl.
CPC ........ *H01L 25/0657* (2013.01); *H01L 23/481* (2013.01); *H01L 24/08* (2013.01); *H01L 24/80* (2013.01); *H01L 25/50* (2013.01); *H01L 2224/08146* (2013.01); *H01L 2224/80006* (2013.01); *H01L 2224/80895* (2013.01); *H01L 2224/80896* (2013.01); *H01L 2225/06524* (2013.01); *H01L 2225/06541* (2013.01); *H01L 2225/06568* (2013.01); *H01L 2225/06586* (2013.01)

(58) Field of Classification Search
None
See application file for complete search history.

(56) References Cited

U.S. PATENT DOCUMENTS

| 7,074,703 | B2 * | 7/2006 | Fukazawa | H01L 21/76898 |
| | | | | 257/E21.597 |
| 8,637,969 | B2 * | 1/2014 | Lee | H01L 24/97 |
| | | | | 257/E25.006 |
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |
| 9,425,126 | B2 | 8/2016 | Kuo et al. | |

(Continued)

*Primary Examiner* — Hung K Vu
(74) *Attorney, Agent, or Firm* — JCIPRNET

(57) ABSTRACT

Provided are integrated circuit packages and methods of forming the same. An integrated circuit package includes at least one first die, a plurality of bumps, a second die and a dielectric layer. The bumps are electrically connected to the at least one first die at a first side of the at least one first die. The second die is electrically connected to the at least one first die at a second side of the at least one first die. The second side is opposite to the first side of the at least one first die. The dielectric layer is disposed between the at least one first die and the second die and covers a sidewall of the at least one first die.

20 Claims, 14 Drawing Sheets

(56) References Cited

U.S. PATENT DOCUMENTS

| | | |
|---|---|---|
| 9,443,783 B2 | 9/2016 | Lin et al. |
| 9,461,018 B1 | 10/2016 | Tsai et al. |
| 9,496,189 B2 | 11/2016 | Yu et al. |
| 9,530,706 B2 * | 12/2016 | Kang ................. H01L 25/0657 |
| 9,666,502 B2 | 5/2017 | Chen et al. |
| 9,735,131 B2 | 8/2017 | Su et al. |
| 10,410,999 B2 * | 9/2019 | Baloglu ............... H01L 23/367 |
| 2008/0142990 A1 * | 6/2008 | Yu ....................... H01L 25/0657 |
| | | 438/109 |
| 2008/0277793 A1 * | 11/2008 | Noma ................ H01L 21/6835 |
| | | 257/E21.585 |
| 2012/0193779 A1 * | 8/2012 | Lee ........................ H01L 24/97 |
| | | 257/737 |
| 2013/0037935 A1 * | 2/2013 | Xue ................... H01L 23/3114 |
| | | 257/737 |

* cited by examiner

100: S1, TSV1, IS1

100: S1, TSV1, IS1
200: S2, IS2

100: S1, TSV1, IS1
200: S2, IS2

100: S1, TSV1, IS1
200: S2, IS2

100: S1, TSV1, IS1
200: S2, IS2

101: S, TSV, IS
IC: Si, ISi, BSi

101: S, TSV, IS
IC: Si, ISi, BSi

METHODS OF FORMING INTEGRATED CIRCUIT PACKAGES

CROSS-REFERENCE

This application is a divisional application of and claims the priority benefit of U.S. patent application Ser. No. 16/441,013, filed on Jun. 14, 2019, now allowed. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuit (3DIC) packages, wafer level packages (WLPs), and package on package (PoP) devices. Some 3DICs are prepared by placing dies over dies on a semiconductor wafer level. The 3DICs provide improved integration density and other advantages, such as faster speeds and higher bandwidth, because of the decreased length of interconnects between the stacked dies. However, there are many challenges related to 3DICs.

DETAILED DESCRIPTION

Figure 1A:
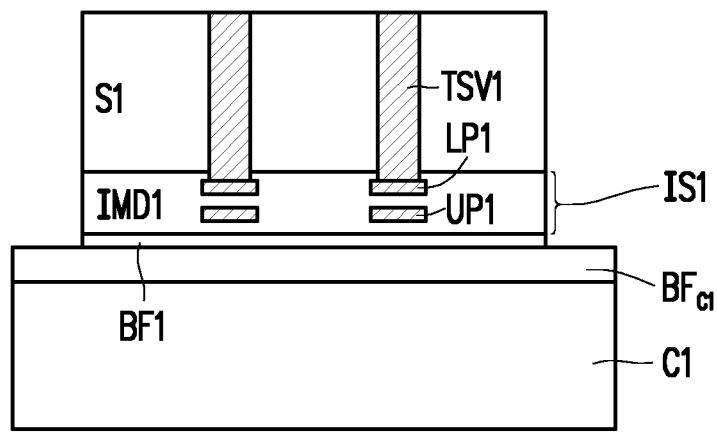
FIG. 1A to FIG. 1G are cross-sectional views of a method of forming an integrated circuit package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1G are cross-sectional views of a method of forming an integrated circuit package in accordance with some embodiments. It is understood that the disclosure is not limited by the method described below. Additional operations can be provided before, during, and/or after the method and some of the operations described below can be replaced or eliminated, for additional embodiments of the methods.

Although FIG. 1A to FIG. 1G are described in relation to a method, it is appreciated that the structures disclosed in FIG. 1A to FIG. 1G are not limited to such a method, but instead may stand alone as structures independent of the method.

Referring to FIG. 1A, a first die 100 is provided. The first die 100 may include one or more active components and/or passive components. In some embodiments, the first die 100 may include a logic die, a memory die, a CPU, a GPU, an xPU, a MEMS die, a SoC die, or the like. In some embodiments, the first die 100 includes a semiconductor substrate S1, a plurality of through substrate vias TSV1 and an interconnect structure IS1.

The semiconductor substrate S1 includes an elementary semiconductor such as silicon, germanium and/or a compound semiconductor such as silicon germanium, silicon carbide, gallium arsenic, indium arsenide, gallium nitride or indium phosphide. The semiconductor substrate S1 may include a silicon-containing material. For example, the semiconductor substrate S1 is a silicon-on-insulator (SOI) substrate or a silicon substrate. In various embodiments, the semiconductor substrate S1 may take the form of a planar substrate, a substrate with multiple fins, nanowires, or other forms known to people having ordinary skill in the art. Depending on the requirements of design, the semiconductor substrate S1 may be a P-type substrate or an N-type substrate and may have doped regions therein. The doped regions may be configured for an N-type device or a P-type device. The semiconductor substrate S1 includes isolation structures defining at least one active area, and at least one device is disposed on and/or in the active area. In some embodiments, the device includes a gate dielectric layer, a gate electrode, source/drain regions, spacers, and the like.

The through substrate vias (e.g., through silicon vias) TSV1 penetrate through the semiconductor substrate S1. The through substrate vias TSV1 may include Cu, Ti, Ta, W, Ru, Co, Ni, the like, or a combination thereof. In some embodiments, a seed layer and/or a barrier layer may be disposed between each through substrate via TSV1 and the semiconductor substrate S1. The seed layer may include Ti/Cu. The barrier layer may include Ta, TaN, Ti, TiN, CoW or a combination thereof. In some embodiments, the top portions of the through substrate vias TSV1 extend into the interconnect structure IS1.

The interconnect structure IS1 may be disposed over a first side (e.g., front side) of the semiconductor substrate S1. Specifically, the interconnect structure IS1 may be disposed over and electrically connected to the device. In some embodiments, the interconnect structure IS1 includes inter-metal dielectric layers IMD1 and metal features embedded in the inter-metal dielectric layers IMD1. The inter-metal dielectric layers IMD1 may include silicon oxide, silicon nitride, silicon oxynitride, a low dielectric constant (low-k) material having a dielectric constant less than 3.5, the like, or a combination thereof. The metal features may include Al, Cu, Ti, Ta, W, Ru, Co, Ni, the like, or a combination thereof. In some embodiments, a seed layer and/or a barrier layer may be disposed between each metal feature and the corresponding inter-metal dielectric layer IMD1. The seed layer may include Ti/Cu. The barrier layer may include Ta, TaN, Ti, TiN, CoW or a combination thereof. In some embodiments, the metal features include upper pads UP1 configured to bond the first die 100 to the desired components such as bumps, and lower pads LP1 configured for the through substrate vias TSV1 to land thereon. In some embodiments, the upper pads UP1 and the lower pads LP1 include different materials. For example, the upper pads UP1 may include Al, and the lower pads LP1 may include Cu. In alternative embodiments, the upper pads UP1 and the lower pads LP1 may include the same material.

A bonding film BF1 is optionally included in the first die 100. The bonding film BF1 may be disposed over the first side (e.g., front side) of the semiconductor substrate S1. Specifically, the bonding film BF1 may be disposed over the interconnect structure IS1. In some embodiments, the bonding film BF1 includes silicon oxide, silicon nitride, the like, or a combination thereof. In another embodiment, a polymer, such as benzocyclobutene (BCB), epoxy, an organic glue, or the like, is utilized as a bonding material of the bonding film BF1.

Still referring to FIG. 1A, a carrier C1 is provided. The carrier C1 has a bonding film $BF_{C1}$ formed thereon. In some embodiments, the carrier C1 is a glass substrate or a semiconductor substrate, and the bonding film $BF_{C1}$ includes silicon oxide, silicon nitride, the like, or a combination thereof. In another embodiment, a polymer, such as benzocyclobutene (BCB), epoxy, an organic glue, or the like, is utilized as a bonding material of the bonding film $BF_{C1}$. In some embodiments, the bonding film $BF_{C1}$ of the carrier C1 includes a material the same as that of the bonding film BF1 of the first die 100. In alternative embodiments, the bonding film $BF_{C1}$ of the carrier C1 and the bonding film BF1 of the first die 100 may include different materials.

Again referring to FIG. 1A, the first die 100 is bonded to the carrier C1 at the first side (e.g., front side) of the first die 100. The first die 100 may be referred to as a tier-1 die in some examples. In some embodiments, the first die 100 is bonded to the carrier C1 through a fusion bonding. Specifically, the bonding film BF1 of the first die 100 is bonded to the bonding film $BF_{C1}$ of the carrier C1. However, the disclosure is not limited thereto, and another bonding technique, such as direct bonding, metal diffusion, anodic bonding, hybrid bonding including a metal-to-metal bonding and a dielectric-to-dielectric bonding, or the like, may be applied.

Figure 1B:
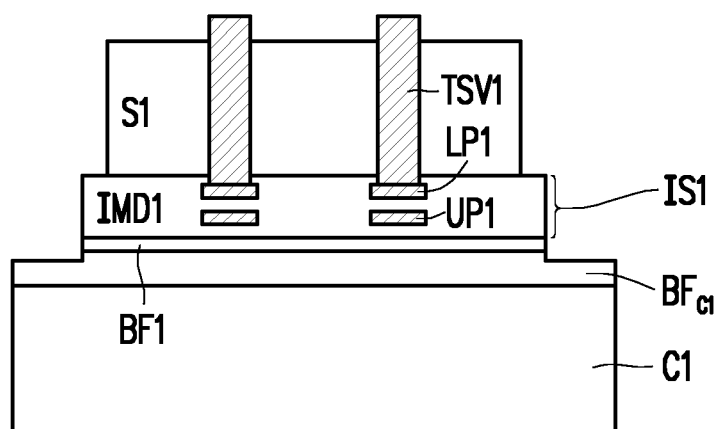

Referring to FIG. 1B, the semiconductor substrate S1 is partially removed to expose portions (e.g., bottom portions) of the through substrate vias TSV1. In some embodiments, the partial removal operation includes performing an isotropic etching, such as a dry etching. In some embodiments, the etching gas includes a fluorine-containing gas, such as $NF_3$, $SF_6$, $CF_4$, $CHF_3$, $CH_2F_2$, the like or a combination thereof.

In some embodiments, after partially removing the semiconductor substrate S1, the interconnect structure IS1 is wider than the remaining semiconductor substrate S1. Specifically, the partial removal operation not only removes the bottom portion of the semiconductor substrate S1 to expose the bottom portions of the through substrate vias TSV1, but also removes the side portion of the semiconductor substrate S1 to expose a portion of the inter-metal dielectric layer IMD1 of the interconnect structure IS1. In some embodiments, the bonding film $BF_{C1}$ of the carrier C1 is partially removed during the operation of partially removing the semiconductor substrate S1. Accordingly, the remaining bonding film $BF_{C1}$ is thicker in the central region while thinner in the edge region thereof.

Figure 1C:
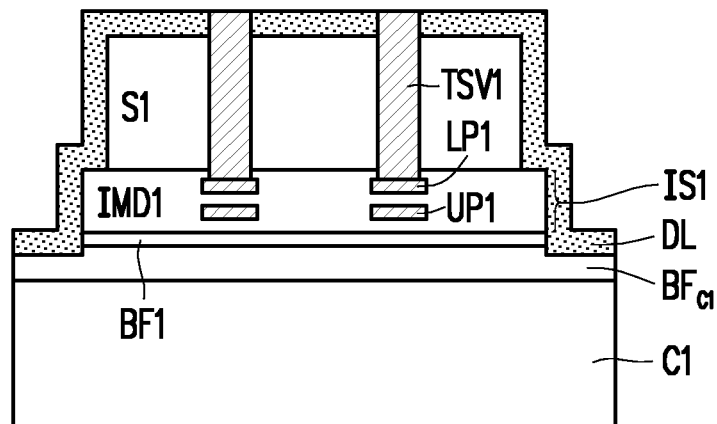

Referring to FIG. 1C, a dielectric layer DL is formed over the top and the sidewall of the first die 100 and around the exposed portions (e.g., bottom portions) of the through substrate vias TSV1. In some embodiments, the dielectric layer DL further extends laterally away from the first die 100 and covers the exposed top surface of the bonding film $BF_{C1}$ of the carrier C1.

The dielectric layer DL of the disclosure not only functions as a bonding film for bonding the first die 100 to the desired component such as a second die, but also functions as an isolation film for isolating the first die 100 from undesired components or materials. In some embodiments, the dielectric layer DL may include silicon oxide, silicon nitride, silicon oxynitride, a low-k material having a dielectric constant less than 3.5 (e.g., carbon doped oxide), the like, or a combination thereof. The method of forming the dielectric layer DL includes the following operations. A dielectric material layer is formed over the carrier C1 covering the first die 100 through a suitable process such as chemical vapor deposition (CVD) or plasma enhanced CVD (PECVD), although any suitable process may be utilized. Thereafter, a planarization process such as a chemical mechanical polishing (CMP) is performed to partially remove the dielectric material layer, until the surfaces (e.g., bottom surfaces) of the through substrate vias TSV1 are exposed.

Figure 1D:
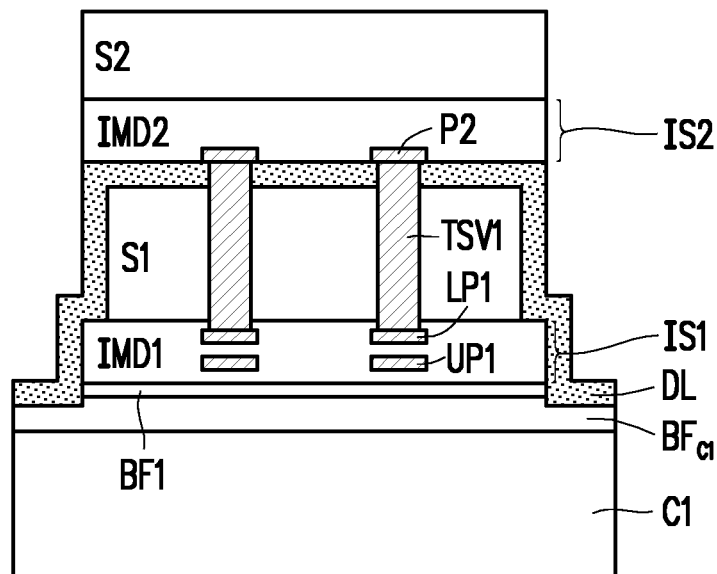

Referring to FIG. 1D, a second die 200 is provided. The second die 200 may include one or more active components and/or passive components. In some embodiments, the second die 200 may include a logic die, a memory die, a CPU, a GPU, an xPU, a MEMS die, a SoC die, or the like. The function of the second die 200 may be different from that of the first die 100. For example, one of the first and second dies is a logic die, and the other of the first and second dies is a memory die. The first and second dies may have similar function as needed.

The second die 200 may have a structure similar to that of the first die 100, and the materials and configurations thereof may refer to those of the first die 100. In some embodiments, the second die 200 includes a semiconductor substrate S2 and an interconnect structure IS2.

The semiconductor substrate S2 may be similar to the semiconductor substrate S1, so the material and configuration thereof may refer to those of the semiconductor substrate S1. In some embodiments, the semiconductor substrate S2 may have through substrate vias such as through silicon vias as needed. In some embodiments, the semiconductor substrate S2 includes isolation structures defining at least one active area, and at least one device is disposed on and/or in the active area. In some embodiments, the width of the semiconductor substrate S2 is greater than the width of the semiconductor substrate S1, as shown in FIG. 1D. However, the present disclosure is not limited thereto. In alternative embodiments, the semiconductor substrate S2 is substantially as wide as the semiconductor substrate S1. In yet alternative embodiments, the width of the semiconductor substrate S2 may be less than the width of the semiconductor substrate S1 as needed.

The interconnect structure IS2 may be similar to the interconnect structure IS1, so the material and configuration thereof may refer to those of the interconnect structure IS1. In some embodiments, the interconnect structure IS2 may be disposed over a first side (e.g., front side) of the semiconductor substrate S2. Specifically, the interconnect structure IS2 is disposed over and electrically connected to the device. In some embodiments, the interconnect structure IS2 includes inter-metal dielectric layers IMD2 and metal features embedded in the inter-metal dielectric layers IMD2. In some embodiments, the metal features include pads P2 configured to bond the second die 200 to the through substrate vias TSV1 of the first die 100. In some embodiments, the interconnect structure IS2 is substantially as wide as the interconnect structure IS1, as shown in FIG. 1D. However, the present disclosure is not limited thereto. In alternative embodiments, the interconnect structure IS2 and the interconnect structure IS1 may have different widths.

Still referring to FIG. 1D, the second die 200 is bonded to the first die 100 at a second side (e.g., back side) of the first die 100. The second die 200 may be referred to as a tier-2 die in some examples. In some embodiments, the second die 200 is bonded to the first die 100 through a hybrid bonding including a metal-to-metal bonding and a dielectric-to-dielectric bonding. Specifically, the pads P2 of the second die 200 is bonded to the through substrate vias TSV1 of the first die 100, and the inter-metal dielectric layer IMD2 is bonded to the dielectric layer DL over the first die 100. However, the disclosure is not limited thereto, and another bonding technique, such as direct bonding, metal diffusion, anodic bonding, fusion bonding, or the like, may be applied.

In some embodiments, the second die 200 and the first die 100 are stacked in a face-to-back configuration, as shown in FIG. 1D. However, the disclosure is not limited thereto, and another back-to-back configuration may be applied.

Figure 1E:
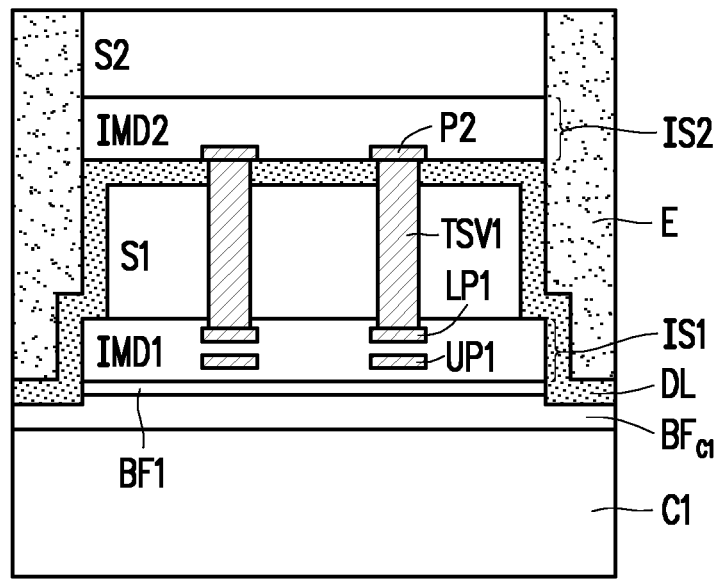

Referring to FIG. 1E, a dielectric encapsulation E is formed around the first die 100 and the second die 200. The dielectric encapsulation E may be referred to as a gap filling layer in some examples. In some embodiments, the dielectric encapsulation E includes a molding compound, a molding underfill, a resin or the like. In some embodiments, the dielectric encapsulation E includes a polymer material such as polybenzoxazole (PBO), polyimide, benzocyclobutene (BCB), the like, or a combination thereof. In alternative embodiments, the dielectric encapsulation E includes silicon oxide, silicon nitride or a combination thereof. In some embodiments, the method of forming the dielectric encapsulation E includes the following operations. An encapsulation material layer is formed over the carrier C1 covering the first die 100 and second die 200 through a suitable process such as molding process or a deposition process, although any suitable process may be utilized. Thereafter, a planarization process such as a chemical mechanical polishing (CMP) is performed to partially remove the encapsulation material layer, until the surface (e.g., bottom surface) of the semiconductor substrate S2 is exposed.

Figure 1F:
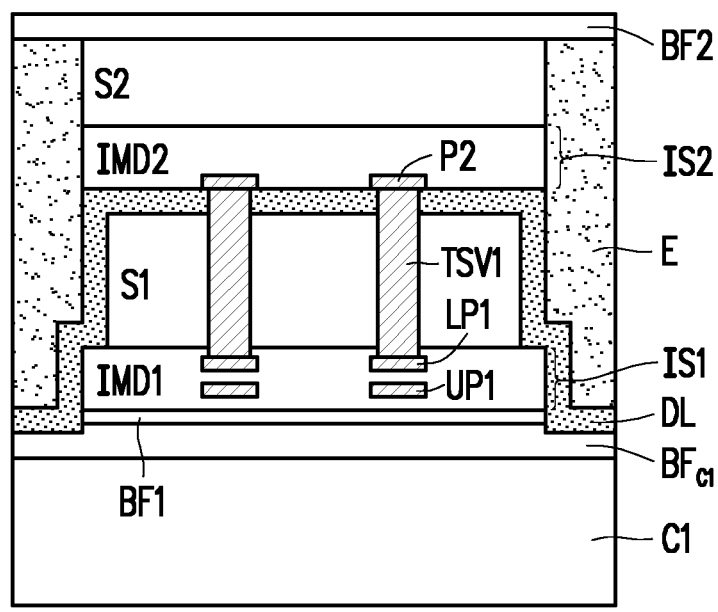

Referring to FIG. 1F, a bonding film BF2 is formed over the second die 200 and the dielectric encapsulation E. In some embodiments, the bonding film BF2 includes silicon oxide, silicon nitride, the like, or a combination thereof. In another embodiment, a polymer, such as benzocyclobutene (BCB), epoxy, an organic glue, or the like, is utilized as a bonding material of the bonding film BF2.

Figure 1G:
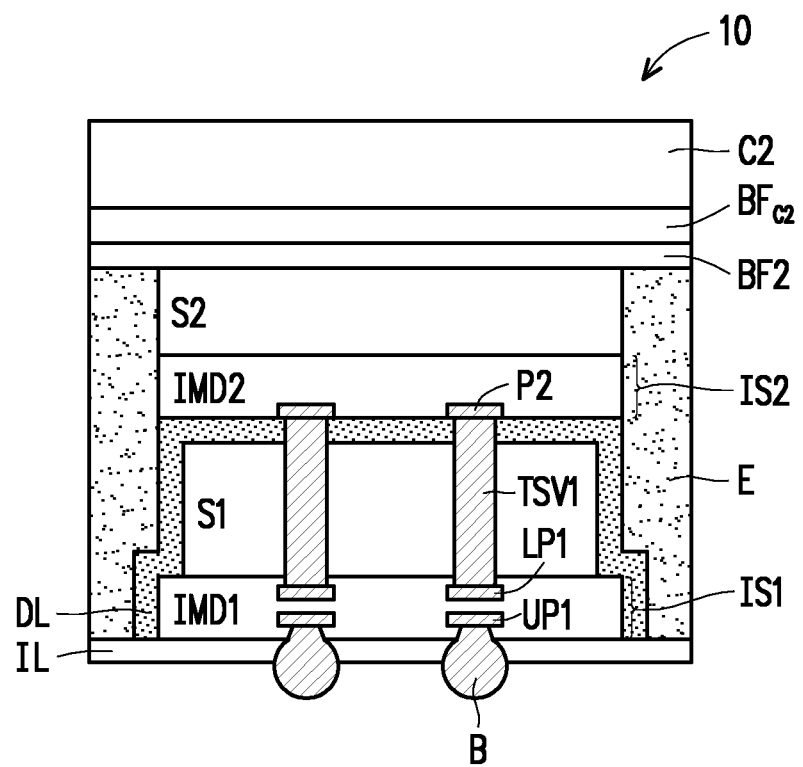

Referring to FIG. 1G, a second carrier C2 is provided. The carrier C2 has a bonding film $BF_{C2}$ formed thereon. In some embodiments, the carrier C2 is a glass substrate or a semiconductor substrate, and the bonding film $BF_{C2}$ includes silicon oxide, silicon nitride, the like, or a combination thereof. The carrier C2 may be referred to as a cover member in some examples. In another embodiment, a polymer, such as benzocyclobutene (BCB), epoxy, an organic glue, or the like, is utilized as a bonding material of the bonding film $BF_{C2}$. In some embodiments, the bonding film $BF_{C2}$ of the carrier C2 includes a material the same as that of the bonding film BF2 over the second die 200. In alternative embodiments, the bonding film $BF_{C2}$ of the carrier C2 and the bonding film BF2 over the second die 200 may include different materials.

Still referring to FIG. 1G, the second carrier C2 is bonded to the second die 200. In some embodiments, the carrier C2 is bonded to the second die 200 through a fusion bonding. Specifically, the bonding film $BF_{C2}$ of the carrier C2 is bonded to the bonding film BF2 of the second die 200. However, the disclosure is not limited thereto, and another bonding technique, such as direct bonding, metal diffusion, anodic bonding, hybrid bonding including a metal-to-metal bonding and a dielectric-to-dielectric bonding, or the like, may be applied.

Again referring to FIG. 1G, the carrier C1 is removed. In some embodiments, during the operation of removing the carrier C1, the bonding film BF1 of the first die 100 and the bonding film $BF_{C1}$ of the carrier C1 are simultaneously removed.

Thereafter, an insulation layer IL is formed over the first side (e.g., front side) of the first die 100. In some embodiments, the insulating layer IL may include silicon oxide or a suitable dielectric material and may be formed by a suitable deposition process.

Afterwards, a plurality of bumps B is formed at the first side (e.g., front side) of the first die 100. The bumps B are disposed over and electrically connected to the upper pads UP1 of the interconnect structure IS1. In some embodiments, the bumps B include copper, solder, nickel or a combination thereof. In some embodiments, the bumps B may be solder balls, controlled collapse chip connection (C4) bumps, ball grid array (BGA) balls, micro bumps, electroless nickel-electroless palladium-immersion gold technique (ENEPIG) formed bumps, cupper pillar, hybrid bonding bumps, or the like. An integrated circuit package 10 of the disclosure is thus completed.

Figure 2:
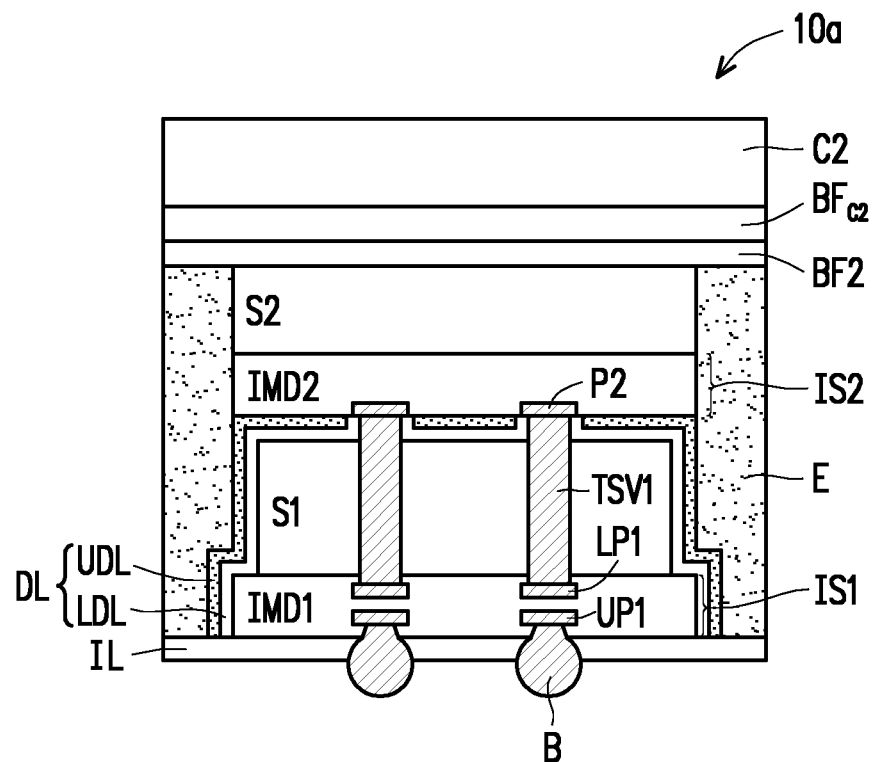
FIG. 2 is a cross-sectional view of an integrated circuit package in accordance with some embodiments.

The above embodiments in which the dielectric layer DL is a single layer are provided for illustration purposes, and are not construed as limiting the present disclosure. Specifically, the dielectric layer DL of the disclosure may be formed to have a multi-layer structure as needed. In some embodiments, an integrated circuit package 10a of the disclosure is formed when the dielectric layer DL in FIG. 1C is formed to have a multi-layer structure including a lower dielectric layer LDL and an upper dielectric layer UDL, as shown in FIG. 2. The lower dielectric layer LDL and the upper dielectric layer UDL may include different materials and provide different functions. For example, the lower dielectric layer LDL functions as an adhesion film for improving the adhesion between the upper dielectric layer UDL and copper or silicon, and the upper dielectric layer UDL functions as a bonding film for bonding the first die 100 to the second die 200. In some embodiments, each of the lower dielectric layer LDL and the upper dielectric layer UDL may include silicon oxide, silicon nitride, silicon oxynitride, a low-k material having a dielectric constant less than 3.5 (e.g., carbon doped oxide), the like, or a combination thereof.

The above embodiments in which the integrated circuit package has a first die bonded to a second die are provided for illustration purposes, and are not construed as limiting the present disclosure. In some embodiments, a die stack including multiple first dies may be provided and then bonded to a second die. In alternative embodiments, the number of the second dies may be adjusted as needed.

FIG. 3A to FIG. 3F are cross-sectional views of a method of forming an integrated circuit package in accordance with some embodiments. It is understood that the disclosure is not limited by the method described below. Additional operations can be provided before, during, and/or after the method and some of the operations described below can be replaced or eliminated, for additional embodiments of the methods.

Although FIG. 3A to FIG. 3F are described in relation to a method, it is appreciated that the structures disclosed in FIG. 3A to FIG. 3F are not limited to such a method, but instead may stand alone as structures independent of the method.

Figure 3A:
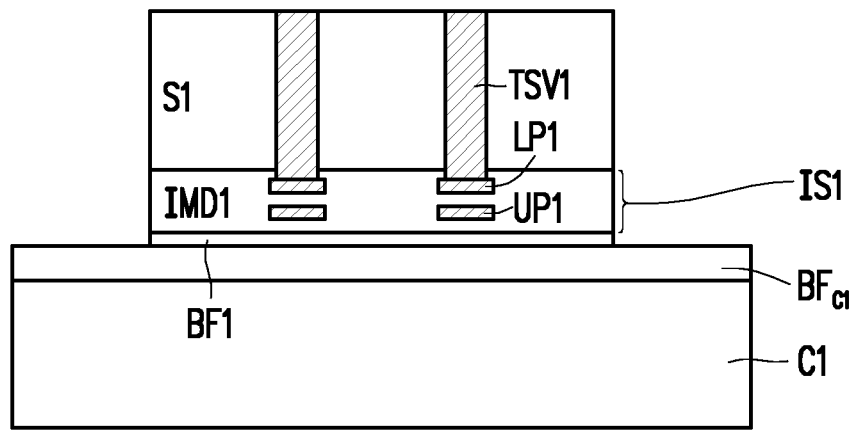
FIG. 3A to FIG. 3F are cross-sectional views of a method of forming an integrated circuit package in accordance with some embodiments.

Referring to FIG. 3A, a tier-1 first die 100 is bonded to a carrier C1 at a first side (e.g., front side) of the tier-1 first die 100. The operation of FIG. 3A is similar to the operation of FIG. 1A, and the details are not iterated herein.

Figure 3B:
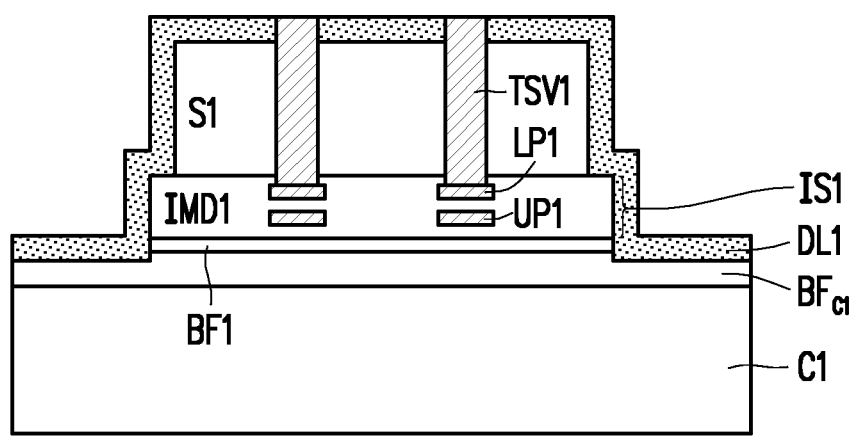

Referring to FIG. 3B, the semiconductor substrate S1 of the tier-1 first die 100 is partially removed to expose portions of the through substrate vias TSV1, and a dielectric layer DL1 is formed over the top and the sidewall of the tier-1 first die 100 and around the exposed portions of the through substrate vias TSV1. The operation of FIG. 3B includes the operations similar to those described in FIG. 1B and FIG. 1C, and the details are not iterated herein. In some embodiments, the dielectric layer DL further extends laterally away from the tier-1 first die 100 and covers the exposed top surface of the bonding film $BF_{C1}$ of the carrier C1. In some embodiments, the dielectric layer DL1 may include silicon oxide, silicon nitride, silicon oxynitride, a low-k material having a dielectric constant less than 3.5 (e.g., carbon doped oxide), the like, or a combination thereof.

Figure 3C:
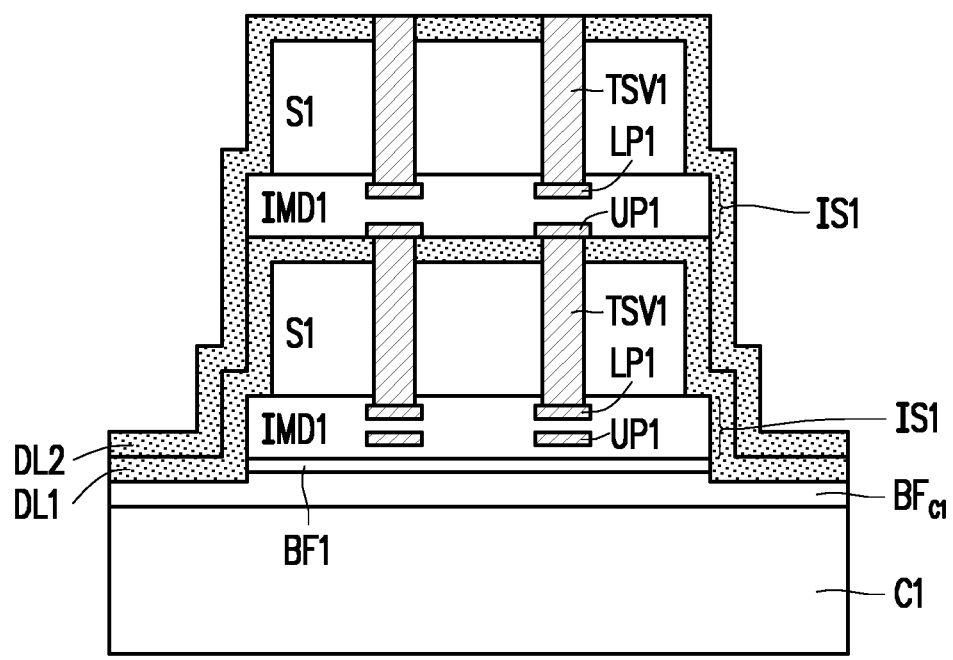

Referring to FIG. 3C, a tier-2 first die 100 is bonded to the tier-1 first die 100 at a second side (e.g., back side) of the tier-1 first die 100. In some embodiments, the tier-2 first die 100 is bonded to the tier-1 first die 100 through a hybrid bonding including a metal-to-metal bonding and a dielectric-to-dielectric bonding. Specifically, the upper pads UP1 of the tier-2 first die 100 is bonded to the through substrate vias TSV1 of the tier-1 first die 100, and the inter-metal dielectric layer IMD1 of the tier-2 first die 100 is bonded to the dielectric layer DL1 over the tier-1 first die 100. However, the disclosure is not limited thereto, and another bonding technique, such as direct bonding, metal diffusion, anodic bonding, fusion bonding, or the like, may be applied.

In some embodiments, the tier-2 first die 100 and the tier-1 first die 100 are stacked in a face-to-back configuration, as shown in FIG. 3C. However, the disclosure is not limited thereto, and another back-to-back configuration may be applied.

In some embodiments, the upper pads UP1 and the lower pads LP1 of the interconnect structure IS1 of the tier-2 first die 100 may include the same material, such as Cu; however, the upper pads UP1 and the lower pads LP1 of the interconnect structure IS1 of the tier-1 first die 100 may include the different materials, such as Al and Cu, respectively.

Thereafter, the semiconductor substrate S1 of the tier-2 first die 100 is partially removed to expose portions of the through substrate vias TSV1, and a dielectric layer DL2 is formed over the top and the sidewall of the tier-2 first die 100 and around the exposed portions of the through substrate vias TSV1. In some embodiments, the dielectric layer DL2 further covers the dielectric layer DL1 on the sidewall of the tier-1 first die 100, and extends laterally away from the first dies 100. In some embodiments, the dielectric layer DL2 may include silicon oxide, silicon nitride, silicon oxynitride, a low-k material having a dielectric constant less than 3.5 (e.g., carbon doped oxide), the like, or a combination thereof. In some embodiments, the dielectric layer DL2 and the dielectric layer DL1 include the same material and are formed by the same process, but the disclosure is not limited thereto. In alternative embodiments, the dielectric layer DL2 and the dielectric layer DL1 may include different materials as needed.

Figure 3D:
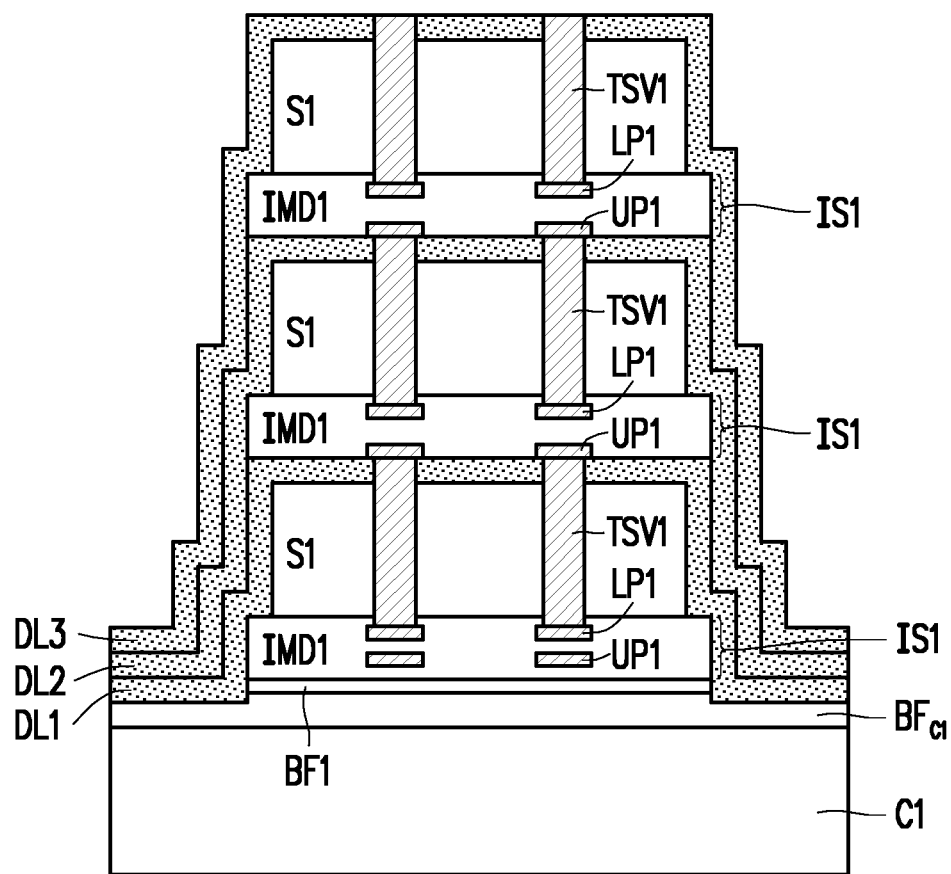

Referring to FIG. 3D, the tier-3 first die 100 is bonded to the tier-2 first die 100 through a hybrid bonding including a metal-to-metal bonding and a dielectric-to-dielectric bonding. Thereafter, the semiconductor substrate S1 of the tier-3 first die 100 is partially removed to expose portions of the through substrate vias TSV1, and a dielectric layer DL3 is formed over the top and the sidewall of the tier-3 first die 100 and around the exposed portions of the through substrate vias TSV1. The operation of FIG. 3D includes the operations similar to those described in FIG. 3B and FIG. 3C. In some embodiments, the dielectric layer DL3 further covers the dielectric layer DL2 on the sidewalls of the tier-1 first die 100 and the tier-2 first die 100, and extends laterally away from the first dies 100. In some embodiments, the dielectric layer DL3 may include silicon oxide, silicon nitride, silicon oxynitride, a low-k material having a dielectric constant less than 3.5 (e.g., carbon doped oxide), the like, or a combination thereof. In some embodiments, the dielectric layer DL3 and the dielectric layer DL2 include the same material and are formed by the same process, but the disclosure is not limited thereto. In alternative embodiments, the dielectric layer DL3 and the dielectric layer DL2 may include different materials as needed.

Figure 3E:
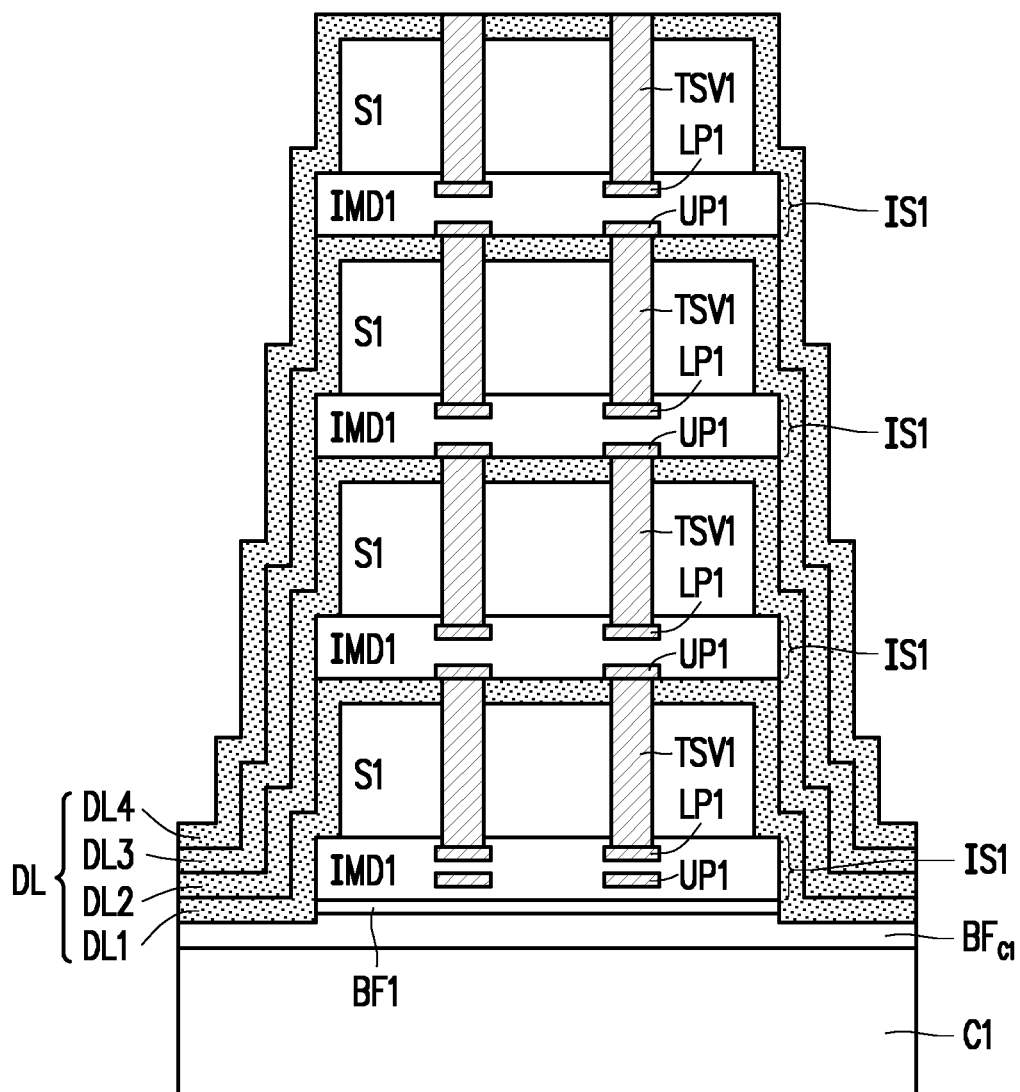

Referring to FIG. 3E, the tier-4 first die 100 is bonded to the tier-3 first die 100 through a hybrid bonding including a metal-to-metal bonding and a dielectric-to-dielectric bonding. Thereafter, the semiconductor substrate S1 of the tier-4 first die 100 is partially removed to expose portions of the through substrate vias TSV1, and a dielectric layer DL4 is formed over the top and the sidewall of the tier-4 first die 100 and around the exposed portions of the through substrate vias TSV1. The operation of FIG. 3E includes the operations similar to those described in FIG. 3B and FIG. 3C. In some embodiments, the dielectric layer DL4 further covers the dielectric layer DL3 on the sidewalls of the tier-1 first die 100, the tier-2 first die 100 and the tier-3 first die 100, and extends laterally away from the first dies 100. In some embodiments, the dielectric layer DL4 may include silicon oxide, silicon nitride, silicon oxynitride, a low-k material having a dielectric constant less than 3.5 (e.g., carbon doped oxide), the like, or a combination thereof. In some embodiments, the dielectric layer DL4 and the dielectric layer DL3 include the same material and are formed by the same process, but the disclosure is not limited thereto. In alternative embodiments, the dielectric layer DL4 and the dielectric layer DL3 may include different materials as needed. In some embodiments, the dielectric layers DL1 to DL4 constitute a dielectric layer DL. The dielectric layer DL of the disclosure not only functions as a bonding film for bonding the die 100 to the desired component such as another die or a redistribution layer structure, but also functions as an isolation film for isolating the first die 100 from undesired components or materials.

In view of the foregoing, the operations described in FIG. 3B and FIG. 3C are performed three times, and a die stack including tier-1 to tier-4 first dies 100 is accordingly formed. The operations described in FIG. 3B and FIG. 3C may be repeated as many times as needed, until the desired number of the first dies 100 is vertically stacked.

Figure 3F:
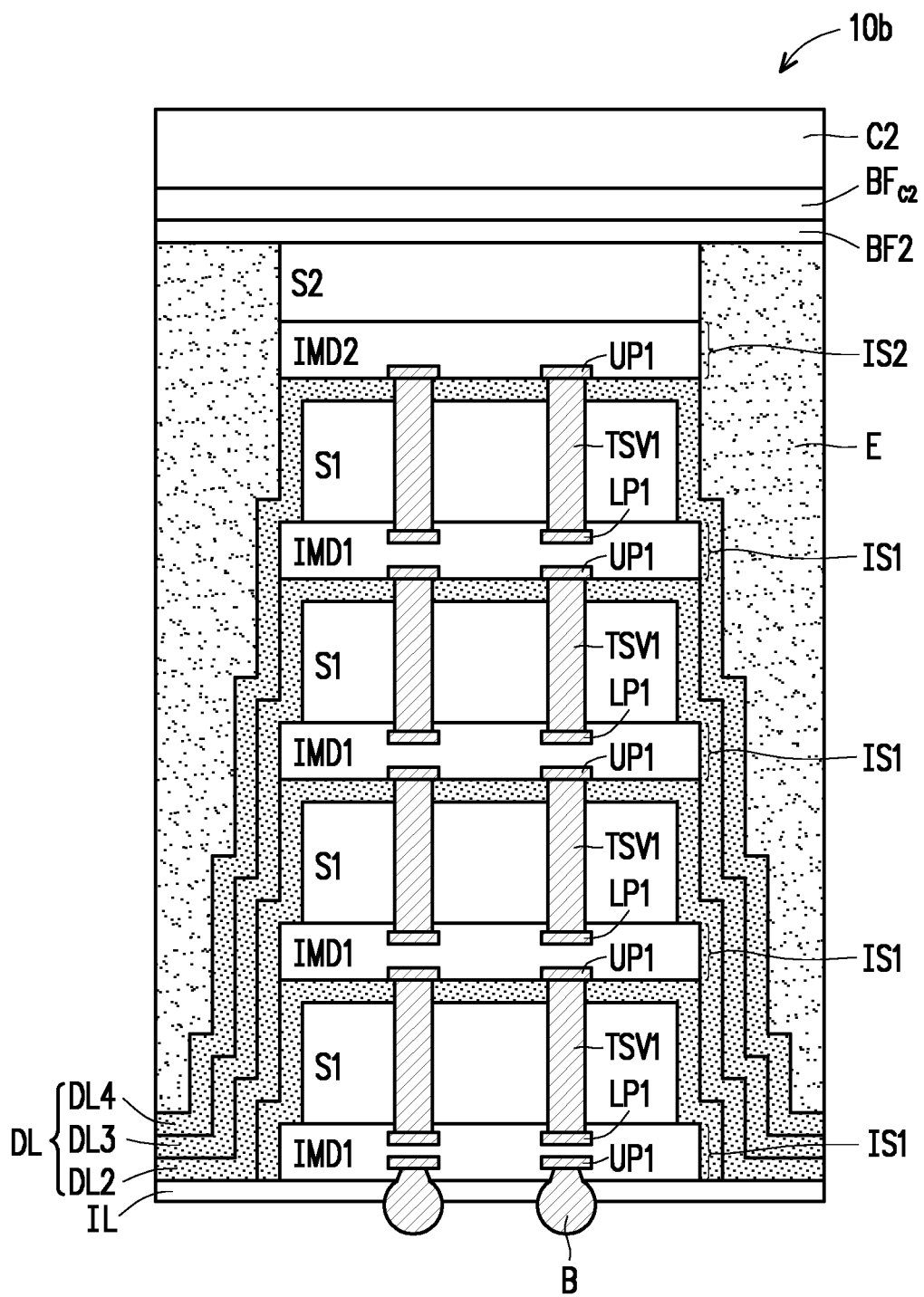

Referring to FIG. 3F, a second die 200 is bonded to the topmost first die 100 (e.g., tier-4 first die 100) of the die stack at a second side (e.g., back side) of the topmost first die 100. Thereafter, a dielectric encapsulation E is formed around the tier-1 to tier-4 first dies 100. Afterwards, a bonding film BF2 is formed over the second die 200 and the dielectric encapsulation E. A second carrier C2 is then bonded to the second die 200. The carrier C1 is removed. In some embodiments, a portion of the dielectric layer DL (e.g., the portion of the dielectric layer DL1 on the carrier C1) is simultaneously removed during the removal of the carrier C1. Next, an insulation layer IL is formed over the first side (e.g., front side) of the lowermost first die 100 (e.g., tier-1 first die 100). Afterwards, a plurality of bumps B is formed at the first side (e.g., front side) of the lowermost first die 100 (e.g., tier-1 first die 100). The operation of FIG. 3F includes the operations similar to those described in FIG. 1D to FIG. 1G, and the details are not iterated herein. An integrated circuit package 10b of the disclosure is thus completed.

The structures of the disclosure are illustrated below with reference to FIG. 1G, FIG. 2 and FIG. 3F.

In some embodiments, an integrated circuit package 10/10a/10b includes at least one first die 100, a plurality of bumps B, a second die 200 and a dielectric layer DL. The bumps B are electrically connected to the at least one first die 100 at a first side (e.g., front side) of the at least one first die 100. The second die 200 is electrically connected to the at least one first die 100 at a second side (e.g., second side) of the at least one first die 100. In some embodiments, the (topmost) first die 100 and the second die 200 are bonded through a hybrid bonding including a metal-to-metal bonding and a dielectric-to-dielectric bonding. The second side is opposite to the first side of the at least one first die 100.

In some embodiments, the first die 100 includes a semiconductor substrate S1 and an interconnect structure IS1, and the interconnect structure IS1 is wider than the semiconductor substrate S1. In some embodiments, the second die 200 includes a semiconductor substrate S2 and an interconnect structure IS2, and the interconnect structure IS2 is substantially as wide as the semiconductor substrate S2. In some embodiments, the semiconductor substrate S2 is wider than the semiconductor substrate S1. In alternative embodiments, the width of the semiconductor substrate S2 may be equal to or less than the width of the semiconductor substrate S1 as needed.

The dielectric layer DL of the disclosure is disposed between the at least one first die 100 and the second die 200 and covers the sidewall of the at least one first die 100. In some embodiments, the dielectric layer DL surrounds portions of through substrate vias TSV1 of the at least one first die 100. In some embodiments, the surface of the dielectric layer DL is substantially coplanar with the surfaces of the through substrate vias TSV1.

In some embodiments, as shown in FIG. 1G, the dielectric layer DL is a single layer. In some embodiments, as shown in FIG. 2 and FIG. 3F, the dielectric layer DL has a multi-layer structure.

In some embodiments, the dielectric layer DL has a stepped sidewall with multiple turning points. In some embodiments, the dielectric layer DL has a one-step profile, as shown in FIG. 1G and FIG. 2. In some embodiments, the dielectric layer DL has a multi-step profile, as shown in FIG. 3F. In some embodiments, the dielectric layer DL further extends laterally away from the first dies 100, as shown in FIG. 3F.

In some embodiments, as shown in FIG. 3F, the at least one first die 100 includes a plurality of first dies 100 vertically stacked. In some embodiments, two adjacent first dies 100 are bonded through a hybrid bonding including a metal-to-metal bonding and a dielectric-to-dielectric bonding. In some embodiments, the dielectric layer DL on the sidewall of the first die 100 (e.g., tier-1 first die 100) away from the second die 200 is thicker than the dielectric layer DL on the sidewall of the first die (e.g., tier-4 first die 100) close to the second die 200. In some embodiments, the dielectric layer DL is further disposed between two adjacent first dies 100.

In some embodiments, the integrated circuit package 10/10a/10b further includes a dielectric encapsulation E disposed around the at least one first die 100 and the second die 200, and a carrier C2 disposed over and bonded to the second die 200. In some embodiments, the dielectric encapsulation E is separated from the at least one first die 100 by the dielectric layer DL.

In view of the above, the dielectric layer of the disclosure is disposed between the adjacent dies and covers the entire sidewalls of the dies. In some embodiments, the lateral portion of each dielectric layer over the corresponding die serves as a bonding film for bonding the die to the desired components, and the stepped sidewall portion of the same serves as an isolation film for isolating the die from undesired components or materials. Besides, the method of the disclosure is simple and compatible with the existing processes.

FIG. 4A to FIG. 4D are cross-sectional views of a method of forming an integrated circuit package in accordance with alternative embodiments. It is understood that the disclosure is not limited by the method described below. Additional operations can be provided before, during, and/or after the method and some of the operations described below can be replaced or eliminated, for additional embodiments of the methods.

Although FIG. 4A to FIG. 4D are described in relation to a method, it is appreciated that the structures disclosed in FIG. 4A to FIG. 4D are not limited to such a method, but instead may stand alone as structures independent of the method.

Figure 4A:
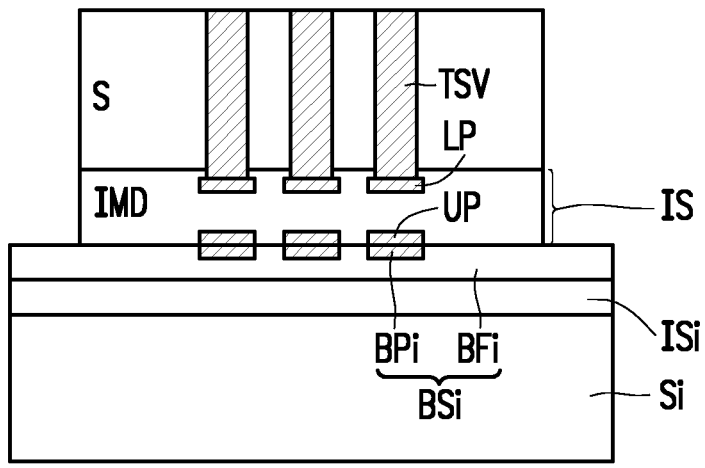
FIG. 4A to FIG. 4D are cross-sectional views of a method of forming an integrated circuit package in accordance with alternative embodiments.

Referring to FIG. 4A, a first die 101 is provided. The first die 101 may include one or more active components and/or passive components. In some embodiments, the first die 101 may include a logic die, a memory die, a CPU, a GPU, an xPU, a MEMS die, a SoC die, or the like. The first die 101 may be similar to the first die 100, and the materials and configurations thereof may refer to those of the first die 100. In some embodiments, the first die 101 includes a semiconductor substrate S, a plurality of through substrate vias TSV and an interconnect structure IS.

The semiconductor substrate S may be similar to the semiconductor substrate S1, so the material and configuration thereof may refer to those of the semiconductor substrate S1. In some embodiments, the semiconductor substrate S includes isolation structures defining at least one active area, and at least one device is disposed on and/or in the active area.

The through substrate vias TSV may be similar to the through substrate vias TSV1, so the material and configuration thereof may refer to those of the through substrate vias TSV1. The through substrate vias (e.g., through silicon vias) TSV penetrate through the semiconductor substrate S. In some embodiments, the top portions of the through substrate vias TSV extend into the interconnect structure IS.

The interconnect structure IS may be similar to the interconnect structure IS1, so the material and configuration thereof may refer to those of the interconnect structure IS1. In some embodiments, the interconnect structure IS may be disposed over a first side (e.g., front side) of the semiconductor substrate S. Specifically, the interconnect structure IS may be disposed over and electrically connected to the device. In some embodiments, the interconnect structure IS includes inter-metal dielectric layers IMD and metal features embedded in the inter-metal dielectric layers IMD. In some embodiments, the metal features include upper pads UP configured to bond the first die 101 to the desired component such as an integrated circuit structure, and lower pads LP configured for the through substrate vias TSV to land thereon. In some embodiments, the upper pads UP and the lower pads LP include the same material. For example, the upper pads UP and the lower pads LP may include Cu. In alternative embodiments, the upper pads UP and the lower pads LP may include different materials.

Still referring to FIG. 4A, an integrated circuit structure IC is provided. The integrated circuit structure IC may include one or more functional devices such as active components and/or passive components. In some embodiments, the integrated circuit structure IC may include a logic die, a memory die, a CPU, a GPU, an xPU, a MEMS die, a SoC die, or the like. The function of the integrated circuit structure IC may be different from that of the first die 101. For example, one of the first die 101 and the integrated circuit structure IC is a logic die, and the other of the first die 101 and the integrated circuit structure IC is a memory die. The first die 101 and the integrated circuit structure IC may have similar function as needed.

In some embodiments, the integrated circuit structure IC has a dimension greater than that of the first die 101, as shown in FIG. 4A. The dimension may be a height, a width, a size, a top-view area or a combination thereof. However, the present disclosure is not limited thereto. In alternative embodiments, the integrated circuit structure IC may have a dimension substantially the same as that of the first die 101.

In some embodiments, the integrated circuit structure IC is a single die structure. The integrated circuit structure IC may be referred to as a bottom wafer in some examples. In some embodiments, the integrated circuit structure IC includes a semiconductor substrate Si, an interconnect structure ISi and a bonding structure BSi.

The semiconductor substrate Si may be similar to the semiconductor substrate S, the material and configuration thereof may refer to those of the semiconductor substrate S. The interconnect structure ISi may be disposed over a first side (e.g., front side) of the semiconductor substrate S. Specifically, the interconnect structure IS may be disposed over and electrically connected to the device on and/or in the semiconductor substrate S. In some embodiments, the interconnect structure ISi includes inter-metal dielectric layers and metal features embedded in the inter-metal dielectric layers.

The bonding structure BSi may be disposed over the first side (e.g., front side) of the semiconductor substrate Si. Specifically, the bonding structure BSi may be disposed over and electrically connected to the interconnect structure ISi. In some embodiments, the bonding structure BSi includes at least one bonding film BFi and bonding metal features embedded in the bonding dielectric layer BFi. In some embodiments, the bonding film BFi includes silicon oxide, silicon nitride, a polymer or a combination thereof. In some embodiments, the bonding metal features include bonding pads BPi electrically connected to the first die 101. The bonding metal features may include Cu, Ti, Ta, W, Ru, Co, Ni, a combination thereof or the like. In some embodiments, a seed layer and/or a barrier layer may be disposed between each bonding metal feature and the bonding film BFi. The seed layer may include Ti/Cu. The barrier layer may include Ta, TaN, Ti, TiN, CoW or a combination thereof.

Again referring to FIG. 4A, the first die 101 is bonded to the integrated circuit structure IS at the first side (e.g., front side) of the first die 101. In some embodiments, the first die 101 is bonded to the integrated circuit structure IC through a hybrid bonding including a metal-to-metal bonding and a dielectric-to-dielectric bonding. Specifically, the upper pads UP of the first die 101 is bonded to the bonding pads BPi of the integrated circuit structure IC, and the inter-metal dielectric layer IMD of the first die 101 is bonded to the bonding film BFi of the integrated circuit structure IC. However, the disclosure is not limited thereto, and another bonding technique, such as direct bonding, metal diffusion, anodic bonding, fusion bonding, or the like, may be applied.

In some embodiments, the first die 101 and the integrated circuit structure IC are stacked in a face-to-face configuration, as shown in FIG. 4A. However, the disclosure is not limited thereto, and another face-to-back configuration may be applied.

Figure 4B:
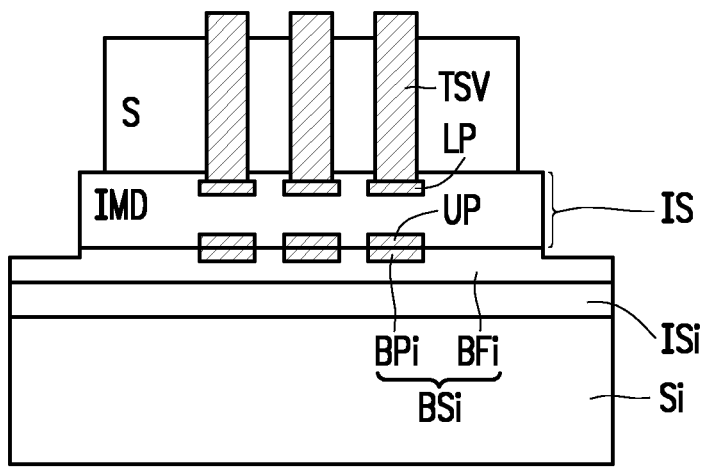

Referring to FIG. 4B, the semiconductor substrate S of the first die 101 is partially removed to expose portions (e.g., bottom portions) of the through substrate vias TSV. In some embodiments, the partial removal operation includes performing an isotropic etching, such as a dry etching. In some embodiments, the etching gas includes a fluorine-containing gas, such as $NF_3$, $SF_6$, $CF_4$, $CHF_3$, $CH_2F_2$, the like or a combination thereof.

In some embodiments, after partially removing the semiconductor substrate S, the interconnect structure IS is wider than the remaining semiconductor substrate S. Specifically, the partial removal operation not only removes the bottom portion of the semiconductor substrate S to expose the bottom portions of the through substrate vias TSV, but also removes the side portion of the semiconductor substrate S to expose a portion of the inter-metal dielectric layer IMD of the interconnect structure IS. In some embodiments, the bonding film BFi of the integrated circuit structure IC is partially removed during the operation of partially removing the semiconductor substrate S. Accordingly, the remaining bonding film BFi is thicker in the central region while thinner in the edge region thereof.

Figure 4C:
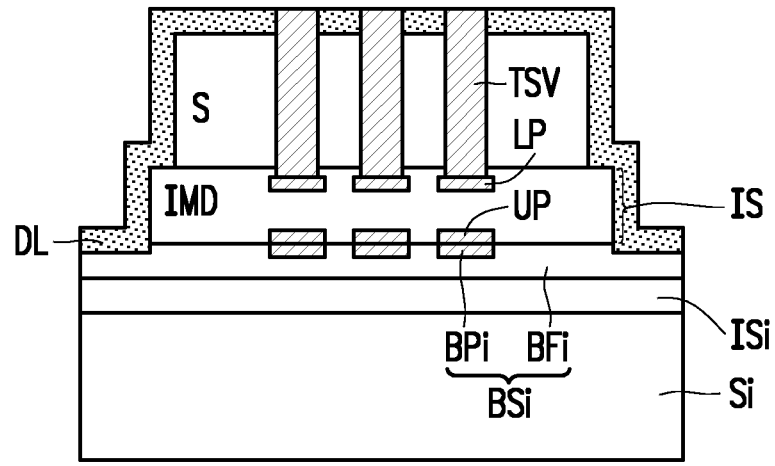

Referring to FIG. 4C, a dielectric layer DL is formed over the top and the sidewall of the first die 101 and around the exposed portions (e.g., bottom portions) of the through substrate vias TSV. In some embodiments, the dielectric layer DL further extends laterally away from the first die 101 and covers the exposed top surface of the bonding film BFi of the integrated circuit structure IC.

The dielectric layer DL of the disclosure not only functions as a bonding film for bonding the first die 101 to the desired component such as a redistribution layer structure, but also functions as an isolation film for isolating the first die 101 from undesired components or materials. In some embodiments, the dielectric layer DL may include silicon oxide, silicon nitride, silicon oxynitride, a low-k material having a dielectric constant less than 3.5 (e.g., carbon doped oxide), the like, or a combination thereof. The method of forming the dielectric layer DL includes the following operations. A dielectric material layer is formed over the integrated circuit structure IC covering the first die 100 through a suitable process such as chemical vapor deposition (CVD) or plasma enhanced CVD (PECVD), although any suitable process may be utilized. Thereafter, a planarization process such as a chemical mechanical polishing (CMP) is performed to partially remove the dielectric material layer, until the surfaces (e.g., bottom surfaces) of the through substrate vias TSV1 are exposed.

Figure 4D:
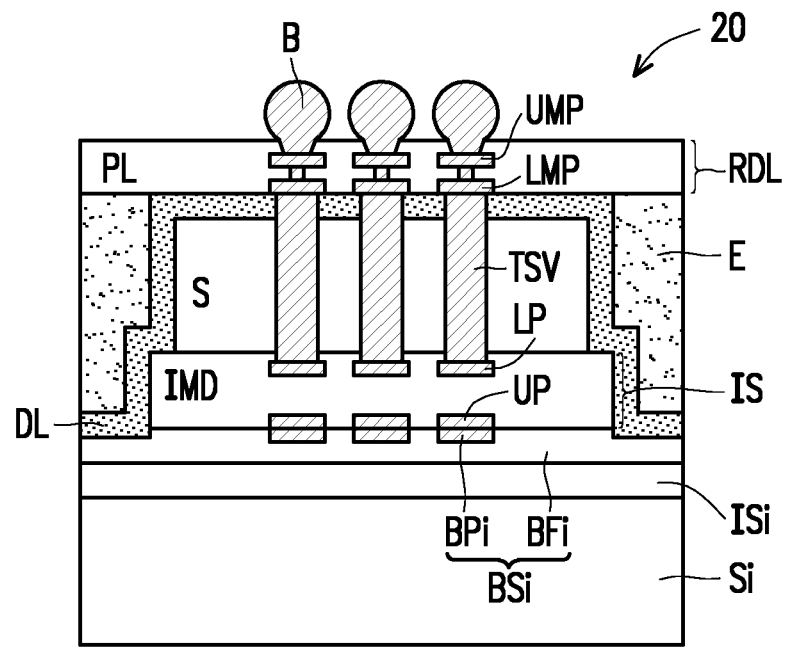

Referring to FIG. 4D, an dielectric encapsulation E is formed around the first die 101 and over the integrated circuit structure IC. In some embodiments, the dielectric encapsulation E is separated from the first die 100 or the integrated circuit structure by the dielectric layer DL.

Still referring to FIG. 4D, a redistribution layer structure RDL is formed over the first die 101 and the dielectric encapsulation E. The redistribution layer structure RDL is formed over the second side (e.g., back side) of the first die 100. The redistribution layer structure RDL may be referred to as a back-side redistribution layer structure in some examples. The redistribution layer structure RDL includes at least one polymer layer PL and conductive features embedded by the polymer layer PL. The conductive features include upper metal pads UMP configured to electrically connect to the desired components such as bumps, and lower metal pads LMP configured to electrically connect to the through substrate vias TSV of the first die 101. In some embodiments, the polymer layer PL may include a photosensitive material such as polybenzoxazole (PBO), polyimide (PI), benzocyclobutene (BCB), a combination thereof or the like. The polymer layer of the redistribution layer structure RDL may be replaced by a dielectric layer or an insulating layer as needed. In some embodiments, the lower metal pads LMP and the upper metal pads UMP may include Cu, Ti, Ta, W, Ru, Co, Ni, a combination thereof or the like. In some embodiments, a seed layer and/or a barrier layer may be disposed between each metal pad and the polymer layer PM. The seed layer may include Ti/Cu. The barrier layer may include Ta, TaN, Ti, TiN, CoW or a combination thereof.

Still referring to FIG. 4D, bumps B are formed to electrically connect to the redistribution layer structure RDL. The bumps B are electrically connected to the first die 101 at a second side (e.g., back side) of the first die 101. An integrated circuit structure 20 of the disclosure is thus completed.

Figure 5:
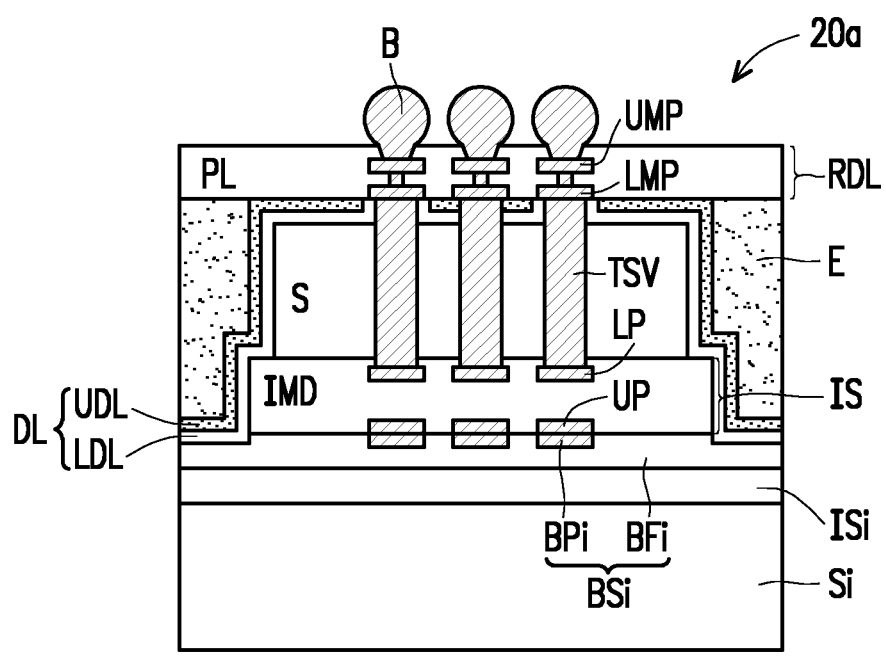
FIG. 5 is a cross-sectional view of an integrated circuit package in accordance with alternative embodiments.

The above embodiments in which the dielectric layer DL is a single layer are provided for illustration purposes, and are not construed as limiting the present disclosure. Specifically, the dielectric layer DL of the disclosure may be formed to have a multi-layer structure as needed. In some embodiments, an integrated circuit package 20a of the disclosure is formed when the dielectric layer DL in FIG. 4C is formed to have a multi-layer structure including a lower dielectric layer LDL and an upper dielectric layer UDL, as shown in FIG. 5. The lower dielectric layer LDL and the upper dielectric layer UDL may include different materials and provide different functions. For example, the lower dielectric layer LDL functions as an adhesion film for improving the adhesion between the upper dielectric layer UDL and copper or silicon, and the upper dielectric layer UDL functions as an isolation film for isolating the first die 101 from undesired components or materials. In some embodiments, each of the lower dielectric layer LDL and the upper dielectric layer UDL may include silicon oxide, silicon nitride, silicon oxynitride, a low-k material having a dielectric constant less than 3.5 (e.g., carbon doped oxide), the like, or a combination thereof.

The above embodiments in which the integrated circuit package has a first die bonded to an integrated circuit structure are provided for illustration purposes, and are not construed as limiting the present disclosure. In some embodiments, a die stack including multiple first dies may be provided and then bonded to an integrated circuit structure. In alternative embodiments, the number of dies included in the integrated circuit structure may be adjusted as needed.

In some embodiments, the operations described in FIG. 4B and FIG. 4C are performed two times, and a die stack including tier-1 to tier-2 first dies 101 is accordingly formed. The operations described in FIG. 4B and FIG. 4C may be repeated as many times as needed, until the desired number of the first dies 101 is vertically stacked. Thereafter, a redistribution layer structure RDL is formed over the second side (e.g., back side) of the topmost first die 101 (e.g., tier-2 first die 101), and bumps B are formed to electrically connect to the redistribution layer structure RDL. An integrated circuit structure 20b of the disclosure is thus completed.

The structures of the disclosure are illustrated below with reference to FIG. 4D, FIG. 5 and FIG. 6.

In some embodiments, an integrated circuit package 20/20a/20b includes at least one first die 101, an integrated circuit structure IC, a dielectric layer DL and a plurality of bumps B. The at least one first die 101 is bonded to the integrated circuit structure IC at a first side (e.g., front side) of the at least one first die 101. In some embodiments, the (lowermost) first die 101 and the integrated circuit structure IC are bonded through a hybrid bonding including a metal-to-metal bonding and a dielectric-to-dielectric bonding. The dielectric layer DL covers the top and the sidewall of the at least one first die 101. The bumps B are electrically connected to the (topmost) first die 101 at a second side (e.g., back side) of the first die 101. The second side is opposite to the first side of the at least one first die 101.

In some embodiments, the first die 101 includes a semiconductor substrate S and an interconnect structure IS, and the interconnect structure IS is wider than the semiconductor substrate S. In some embodiments, the integrated circuit structure IC includes a semiconductor substrate Si and an interconnect structure ISi, and the interconnect structure ISi is substantially as wide as the semiconductor substrate Si. In some embodiments, the semiconductor substrate Si is wider than the semiconductor substrate S.

In some embodiments, the integrated circuit package 20/20a/20b further includes a redistribution layer RDL between the second side (e.g., back side) of the topmost first die 101 and the bumps B.

The dielectric layer DL of the disclosure is disposed between the topmost first die 101 and the redistribution layer structure RDL and covers the sidewall of the at least one first die 100. In some embodiments, the dielectric layer DL surrounds portions of through substrate vias TSV of the at least one first die 101. In some embodiments, the surface of the dielectric layer DL is substantially coplanar with the surfaces of the through substrate vias TSV.

In some embodiments, as shown in FIG. 4D, the dielectric layer DL is a single layer. In some embodiments, as shown in FIG. 5 and FIG. 6, the dielectric layer DL has a multi-layer structure.

In some embodiments, the dielectric layer DL has a stepped sidewall with multiple turning points. In some embodiments, the dielectric layer DL has a one-step profile, as shown in FIG. 4D and FIG. 5. In some embodiments, the dielectric layer DL has a multi-step profile, as shown in FIG. 6. In some embodiments, the dielectric layer DL further extends laterally away from the first dies 101, as shown in FIG. 4D, FIG. 5 and FIG. 6.

Figure 6:
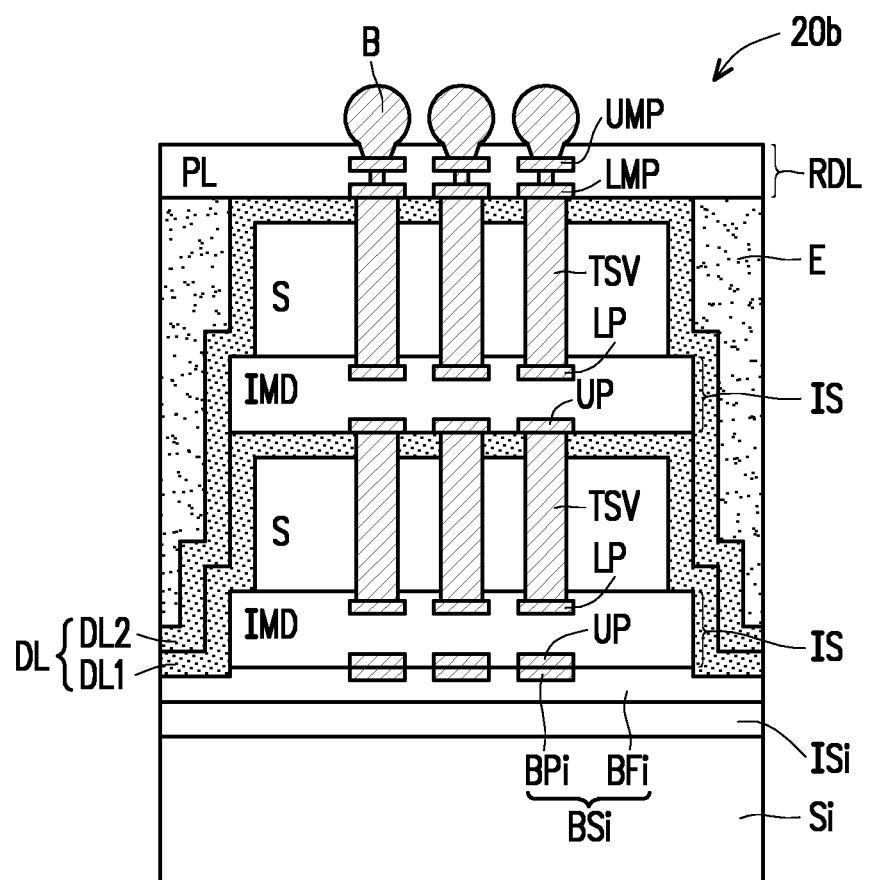
FIG. 6 is a cross-sectional view of an integrated circuit package in accordance with alternative embodiments.

In some embodiments, as shown in FIG. 6, the at least one first die 101 includes a plurality of first dies 101 vertically stacked. In some embodiments, two adjacent first dies 101 are bonded through a hybrid bonding including a metal-to-metal bonding and a dielectric-to-dielectric bonding. In some embodiments, the dielectric layer DL on the sidewall of the first die 101 (e.g., tier-1 first die 101) close to the integrated circuit structure IC is thicker than the dielectric layer DL on the sidewall of the first die (e.g., tier-2 first die 101) away from the integrated circuit structure IC. In some embodiments, the dielectric layer DL is further disposed between two adjacent first dies 101.

In some embodiments, the integrated circuit package 20/20a/20b further includes a dielectric encapsulation E disposed around the at least one first die 101 and over the integrated circuit structure IC. In some embodiments, the dielectric encapsulation E is separated from the at least one first die 101 by the dielectric layer DL.

In view of the above, the dielectric layer of the disclosure is disposed between the adjacent dies and between the topmost die and the redistribution layer structure, and covers the entire sidewalls of the dies. In some embodiments, each dielectric layer over the corresponding die serves as an isolation film for isolating the die from undesired components or materials. Besides, the method of the disclosure is simple and compatible with the existing processes.

Many variations of the above examples are contemplated by the present disclosure. It is understood that different embodiments may have different advantages, and that no particular advantage is necessarily required of all embodiments.

In accordance with some embodiments of the present disclosure, an integrated circuit package includes at least one first die, a plurality of bumps, a second die and a dielectric layer. The bumps are electrically connected to the at least one first die at a first side of the at least one first die. The second die is electrically connected to the at least one first die at a second side of the at least one first die. The second side is opposite to the first side of the at least one first die. The dielectric layer is disposed between the at least one first die and the second die and covers a sidewall of the at least one first die.

In accordance with alternative embodiments of the present disclosure, an integrated circuit package includes at least one first die, an integrated circuit structure, a dielectric layer and a plurality of bumps. The at least one first die is bonded to the integrated circuit structure at a first side of the at least one first die. The dielectric layer covers a top and a sidewall of the at least one first die. The bumps are electrically connected to the at least one first die at a second side of the at least one first die. The second side is opposite to the first side of the at least one first die.

In accordance with yet alternative embodiments of the present disclosure, a method of forming an integrated circuit package includes the following operations. At least one first die is bonded to a first carrier at a first side of the at least one first die, and the first die includes a first semiconductor substrate, a plurality of first through substrate vias penetrating through the first semiconductor substrate and a first interconnect structure over the first substrate. The first semiconductor substrate is partially removed to expose portions of the first through substrate vias. A dielectric layer is formed over a top and a sidewall of the at least one first die and around the exposed portions of the first through substrate vias. A second die is bonded to the at least one first die at a second side of the at least one first die.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit package, comprising:

bonding at least one first die to a first carrier at a first side of the at least one first die, wherein the first die comprises a first semiconductor substrate, a plurality of first through substrate vias penetrating through the first semiconductor substrate and a first interconnect structure over the first substrate;

partially removing the first semiconductor substrate to expose portions of the first through substrate vias;

forming a first dielectric layer over a top and a sidewall of the at least one first die and around the exposed portions of the first through substrate vias; and after forming the first dielectric layer, bonding a second die to the at least one first die at a second side of the at least one first die, wherein the second die has bonding features embedded in a second dielectric layer, and bonding the second die to the at least one first die comprises bonding the bonding features to the first through substrate vias, and bonding the second dielectric layer to the first dielectric layer.

2. The method of claim 1, wherein the first interconnect structure is wider than the first semiconductor substrate after partially removing the first semiconductor substrate.

3. The method of claim 1, wherein forming the first dielectric layer comprises:

forming a dielectric material layer over the first carrier, the dielectric material layer covering the at least one first die; and performing a planarization process to the dielectric material layer until surfaces of the first through substrate vias are exposed.

4. The method of claim 1, further comprising:
forming a dielectric encapsulation around the at least one first die and the second die;
bonding a second carrier to the second die; and
removing the first carrier.

5. The method of claim 4, wherein bonding the second carrier to the second die comprises a fusion bonding.

6. The method of claim 1, wherein the first dielectric layer has a stepped and continuous profile.

7. The method of claim 1, wherein bonding the at least one first die to the first carrier comprises a fusion bonding.

8. The method of claim 1, wherein the first dielectric layer further extends laterally away from the at least one first die.

9. A method of forming an integrated circuit package, comprising:
bonding at least one first die to an integrated circuit structure at a first side of the at least one first die through a metal-to-metal bonding and a dielectric-to-dielectric bonding;
forming an isolation layer to cover a top and a sidewall of the at least one first die, wherein the isolation layer has a turning point conformal to a corner of the at least one first die; and
forming a plurality of bumps electrically connected to the at least one first die at a second side of the at least one first die, wherein the second side is opposite to the first side of the at least one first die.

10. The method of claim 9, wherein a first die of the at least one first die facing the integrated circuit structure has a first bonding pad embedded in a first dielectric layer facing the integrated circuit structure, the integrated circuit structure has a second bonding pad embedded in a second dielectric layer facing the first die, the second bonding pad of the integrated circuit structure is bonded to the first bonding pad of the first die, and the second dielectric layer of the integrated circuit structure is bonded to the first dielectric layer of the first die.

11. The method of claim 9, wherein the first die comprises a first semiconductor substrate and a plurality of first through substrate vias penetrating through the first semiconductor substrate, and the isolation layer surrounds portions of the first through substrate vias.

12. The method of claim 11, wherein the first die further comprises a first interconnect structure between the integrated circuit structure and the first semiconductor substrate, and the first interconnect structure is wider than the first semiconductor substrate.

13. The method of claim 9, wherein the isolation layer has a turning point conformal to a corner of the at least one first die.

14. The method of claim 9, wherein the isolation layer further extends laterally away from the at least one first die.

15. The method of claim 9, wherein the at least one first die comprises a plurality of first dies vertically stacked, and two adjacent first dies are bonded to each other through a metal-to-metal bonding and a dielectric-to-dielectric bonding.

16. The method of claim 15, wherein the isolation layer is further formed between the two adjacent first dies.

17. A method of forming an integrated circuit package, comprising:
bonding a second die to a first die;
forming a first dielectric layer over a top of the second die and along sidewalls of the second die and the first die, wherein the first dielectric layer has at least one turning point along the sidewalls of the second die and the first die;
after forming a first dielectric layer, bonding a third die to the second die, wherein the third die is in contact with the first dielectric layer; and
forming a second dielectric layer over a top of the third die and along sidewalls of the third die, the second die and the first die, the second dielectric layer covering the first dielectric layer.

18. The method of claim 17, wherein the second die is bonded to the first die through a metal-to-metal bonding and a dielectric-to-dielectric bonding.

19. The method of claim 17, wherein the third die is bonded to the second die through a metal-to-metal bonding and a dielectric-to-dielectric bonding.

20. The method of claim 17, further comprising forming a dielectric encapsulation to encapsulate the first die, the second die and the third die and around the second dielectric layer.

* * * * *